United States Patent
Chang et al.

(10) Patent No.: US 9,435,847 B2
(45) Date of Patent: Sep. 6, 2016

(54) METHOD FOR TESTING SPECIAL PATTERN AND PROBE CARD DEFECT IN WAFER TESTING

(71) Applicant: MACRONIX International Co., Ltd., Hsinchu (TW)

(72) Inventors: Shih-Hsien Chang, Hsinchu (TW); Kai-Wen Tu, Hsinchu (TW); Yen Lin, Hsinchu (TW); Ching-Ren Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 272 days.

(21) Appl. No.: 14/316,631

(22) Filed: Jun. 26, 2014

(65) Prior Publication Data

US 2015/0377951 A1 Dec. 31, 2015

(51) Int. Cl.
| | |
|---|---|
| G01R 31/01 | (2006.01) |
| G01R 31/26 | (2014.01) |
| G01R 31/319 | (2006.01) |
| G01R 31/28 | (2006.01) |
| G01R 31/02 | (2006.01) |
| G01R 31/3185 | (2006.01) |
| G01R 31/265 | (2006.01) |
| G01R 1/04 | (2006.01) |

(52) U.S. Cl.
CPC ........... G01R 31/26 (2013.01); G01R 31/2856 (2013.01); G01R 31/2874 (2013.01); G01R 31/2875 (2013.01); G01R 31/2877 (2013.01); G01R 31/31924 (2013.01); G01R 1/0491 (2013.01); G01R 31/265 (2013.01); G01R 31/318511 (2013.01)

(58) Field of Classification Search
CPC .......... G01R 31/2856; G01R 31/2875; G01R 31/2877; G01R 31/2874; G01R 31/31924; G01R 1/0491; G01R 31/265; G01R 31/318511
USPC ......... 324/71, 378, 403, 415, 425, 500, 537, 324/750.01, 750.03, 750.05, 762.01, 324/762.05; 340/500, 506, 540, 584, 635, 340/637
See application file for complete search history.

(56) References Cited

U.S. PATENT DOCUMENTS

| | | | | |
|---|---|---|---|---|
| 5,787,190 A | * | 7/1998 | Peng | ........................ H01L 22/20 257/E21.525 |
| 7,937,234 B2 | * | 5/2011 | St. Pierre | ................ H01L 22/14 438/14 |
| 2007/0211932 A1 | * | 9/2007 | Lee | ........................ G06T 7/0004 382/145 |

* cited by examiner

Primary Examiner — Jermele M Hollington
Assistant Examiner — Raul Rios Russo
(74) Attorney, Agent, or Firm — J.C. Patents

(57) ABSTRACT

Methods for testing a special pattern and testing a probe card defect in wafer testing are provided. In the method for testing the special pattern, a wafer is divided into multiple testing partitions, in which each of the testing partitions includes multiple dies. The dies in each testing partition of the wafer are respectively tested by multiple sites of the probe card to obtain a testing map. Then, a number of the dies having defects and a number of the dies without defect within each of the testing partitions in the testing map are accumulated to construct chi-square test and calculate a maximum P-value. Finally, it is determined whether a minimum of the maximum P-values of all of the testing partitions is smaller than a certain predetermined threshold. If the minimum is smaller than the threshold, it is determined that the testing map of the wafer contains the special pattern.

10 Claims, 7 Drawing Sheets

(a)

(b)

(c)

METHOD FOR TESTING SPECIAL PATTERN AND PROBE CARD DEFECT IN WAFER TESTING

BACKGROUND

1. Technical Field

The invention relates to a wafer testing, and particularly relates to methods for testing a special pattern and testing a probe card defect in wafer testing.

2. Related Art

Before a final package test of an integrated circuit (IC), a chip probing (CP) has to be performed on each die in a wafer to filter the dies having defects and decrease a fabrication cost. The CP is to use probes of a probe card to contact the die on the wafer, and transmit test signals to the die through the probes to test a function of the die, and finally determine the quality of each die through a test program, so as to obtain a testing map of the wafer.

In the wafer test process, a test machine probably has a false judgement due to a setting error of the test machine, misuse of the probe card or damage of the probe card, etc., which not only causes a poor yield, but also causes loss of products and waste of testing time. FIG. 1(a) and FIG. 1(b) are diagrams illustrating distribution of bad dies in conventional CP, in which each dot represents a bad die obtained after the CP. A bad die distribution in a wafer testing map of FIG. 1(a) presents a random pattern, and a bad die distribution of FIG. 1(b) has a special CP pattern (i.e. concentrated to an upper left partition of FIG. 1(b)). The special CP pattern is probably caused by the aforementioned various reasons, which is required to be efficiently found from the general random CP patterns, so as to decrease a chance of false judgement of the test machine.

A current wafer testing map relies on engineer's judgement based on experiences to determine whether the special CP pattern exists, so as to early discover the problem and repair the test machine. However, manual determination is usually inefficient and wastes labour cost.

SUMMARY

The invention is directed to methods for testing a special pattern and testing a probe card defect in wafer testing, by which the special pattern and the probe card defect in wafer testing are automatically detected.

The invention provides a method for testing a special pattern in wafer testing, which is adapted for a test machine to determine whether a testing map of a wafer contains a special pattern. In the method, the wafer is divided into a plurality of testing partitions, where each of the testing partitions includes a plurality of dies, and the dies in each testing partition of the wafer are respectively tested by a plurality of sites of the probe card to obtain a testing map of the wafer. Then, a number of the dies having defects and a number of the dies without defect within each of the testing partitions in the testing map are accumulated to construct chi-square test and calculate a maximum P-value. Finally, it is determined whether a minimum of the maximum P-values of all of the testing partitions is smaller than a certain predetermined threshold. If the minimum is smaller than the threshold, it is determined that the testing map of the wafer contains the special pattern.

In an embodiment of the invention, the step of dividing the wafer into the testing partitions includes dividing the wafer into a plurality of fan-shaped partitions while taking a center of the wafer as a circle center, and dividing the fan-shaped partitions into the testing partitions by circles of different radiuses.

In an embodiment of the invention, the step of dividing the wafer into the testing partitions includes dividing the wafer into a plurality of strip-shaped partitions of a same width to serve as the testing partitions.

In an embodiment of the invention, the step of dividing the wafer into the testing partitions includes adjusting ranges of the testing partitions, such that the testing partitions have a same area.

In an embodiment of the invention, after the step of testing the dies in each testing partition of the wafer by the sites of the probe card to obtain the testing map of the wafer, the method further includes following steps. Ranges of the testing partitions are rotated while taking a center of the wafer as a circle center. A number of the dies having defects and a number of the dies without defect within each of the rotated testing partitions in the testing map are accumulated to construct the chi-square test and calculate the maximum P-value, so as to determine whether the testing map of the wafer contains the special pattern according to whether the minimum of the maximum P-values is smaller than the threshold.

In an embodiment of the invention, in the step of determining whether the minimum of the maximum P-values is smaller than the threshold, when the minimum is smaller than the threshold, the method further determines that the testing map of the testing partition corresponding to the maximum P-value smaller than the threshold contains the special pattern.

The invention provides a method for testing a probe card defect in wafer testing, which is adapted for a test machine to determine whether a probe card of a wafer has a defect. In the method, the wafer is divided into a plurality of testing partitions, where each of the testing partitions includes a plurality of dies, and at least one wafer is tested by a plurality of sites of the probe card to determine whether the dies in the testing partitions of each wafer have defects. Then, a number of the dies having defects and a number of the dies without defect in a result obtained by each of the sites testing the dies of the testing partitions of the at least one wafer are accumulated to construct chi-square test and calculate a maximum P-value. Finally, it is determined whether a minimum of the maximum P-values of all of the sites is smaller than a threshold. If the minimum is smaller than the threshold, it is determined that the probe card has a defect.

In an embodiment of the invention, the step of accumulating the number of the dies having defects and the number of the dies without defect in the result obtained by each of the sites testing the dies of the testing partitions of the wafer to construct the chi-square test and calculate the maximum P-value further excludes the dies located at an edge of the wafer when accumulating the number of the dies having defects and the number of the dies without defect.

In an embodiment of the invention, the step of accumulating the number of the dies having defects and the number of the dies without defect in the result obtained by each of the sites testing the dies of the testing partitions of the wafer to construct the chi-square test and calculate the maximum P-value further includes following steps. A total number of the dies within the testing partitions of the at least one wafer tested by each of the sites is accumulated, and it is determined whether the total number reaches a predetermined value. When the total number reaches the predetermined value, a number of the dies having defects and a number of the dies without defect in the dies tested by each of the sites are accumulated to construct the chi-square test and calculate the maximum P-value.

The invention provides a method for testing wafer testing, which is adapted for a test machine to determine whether a testing result of at least one wafer has a defect. In the method, each wafer is divided into a plurality of testing partitions, where each of the testing partitions includes a plurality of dies, and the dies in the testing partitions of each wafer in the at least one wafer are respectively tested by a plurality of sites of a probe card. Then, a number of the dies having defects and a number of the dies without defect within each of the testing partitions of each wafer are accumulated to construct chi-square test and calculate a maximum P-value. Finally, it is determined whether a minimum of the maximum P-values of all of the testing partitions is smaller than a threshold. If the minimum is smaller than the threshold, it is determined that the wafer testing has a defect.

According to the above descriptions, in the methods for testing the special pattern and testing the probe card defect in wafer testing of the invention, by dividing the wafer into a plurality of testing partitions and testing each of the testing partitions, the number of the dies having defects and the number of the dies without defect are accumulated, and finally whether the testing map of the wafer contains the special pattern or the probe card has a defect is determined through statistics. In this way, the special pattern and the probe card defect of the wafer testing are automatically detected, so as to achieve an effect of saving labor cost.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the invention, a wafer is divided into a plurality of testing partitions according to a testing requirement. After dies within each of the testing partitions are tested by a probe card, a chi-square test method is used to obtain a number of the dies having defects and a number of the dies without defect within each of the testing partitions and calculate a P-value. In this way, whether the testing map of the wafer testing contains a special pattern or whether the probe card used for testing the dies has a defect are automatically determined. Embodiments are provided below for detailed descriptions.

Figure 1:
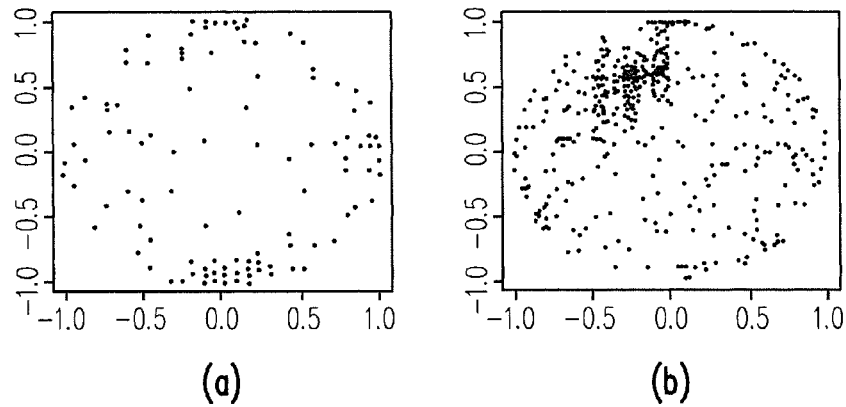
FIG. 1(a) and FIG. 1(b) are diagrams illustrating distribution of bad dies in conventional chip probing (CP).
Figure 2:
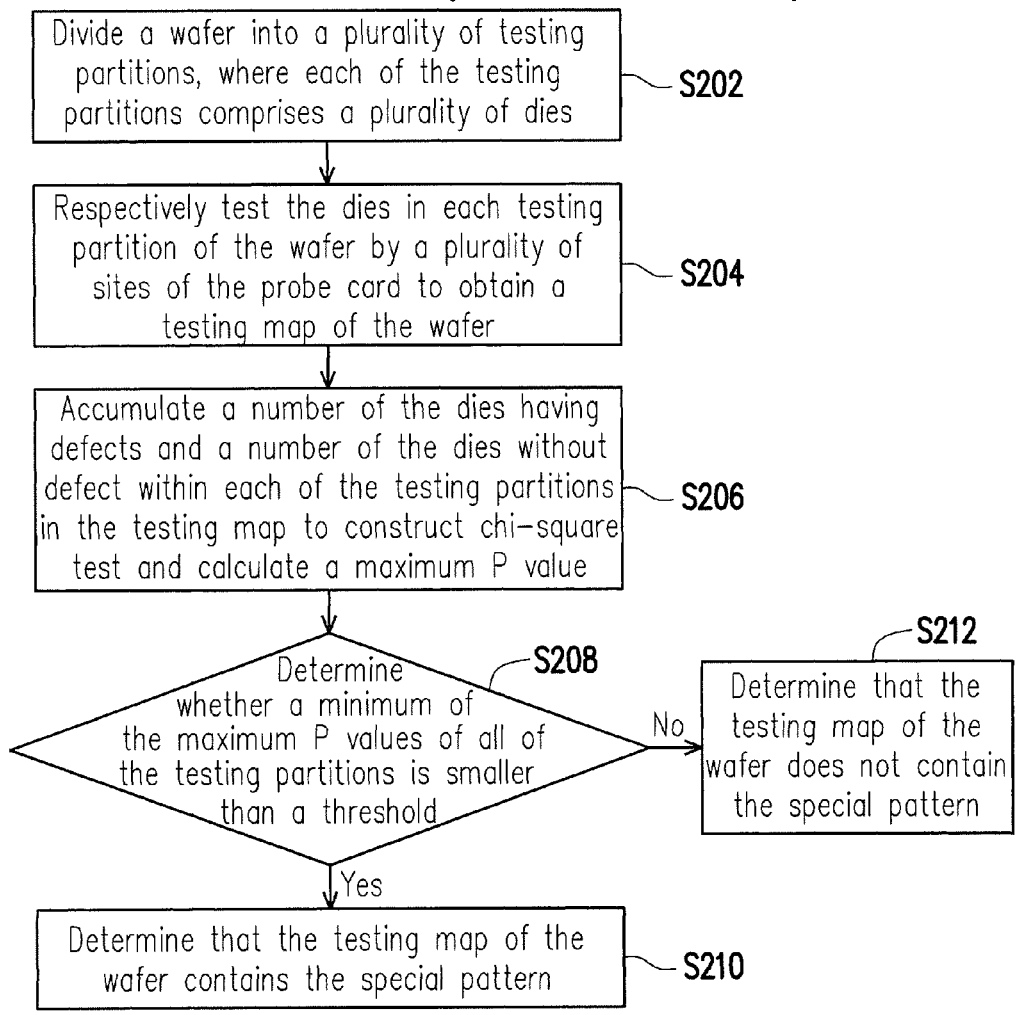
FIG. 2 is a flowchart illustrating a method for testing a special pattern in wafer testing according to an embodiment of the invention.

Regarding testing of special pattern in wafer testing, FIG. 2 is a flowchart illustrating a method for testing a special pattern in wafer testing according to an embodiment of the invention. Referring to FIG. 2, the method of the present embodiment is adapted for a test machine to determine whether a testing map of a wafer has a special pattern. The method includes following steps.

First, the test machine divides the wafer into a plurality of testing partitions according to a testing equipment of a tester, where each of the testing partitions includes a plurality of dies. The test machine can divide the wafer into the testing partitions according to a chip probing (CP) pattern to be tested by the tester to facilitate executing the follow up testing. The CP pattern, for example, includes a cluster pattern, a straight line pattern or other patterns of various shapes, which is not limited by the invention.

In detail, in an embodiment, if the tester selects to test a cluster pattern, the test machine divides the wafer into a plurality of fan-shaped partitions while taking a center of the wafer as a circle center, and divides the fan-shaped partitions into the testing partitions by circles of different radiuses. In another embodiment, if the tester selects to test a straight line pattern, the tester can directly divides the wafer into a plurality of strip-shaped partitions of a same width to serve as the testing partitions.

Figure 3:
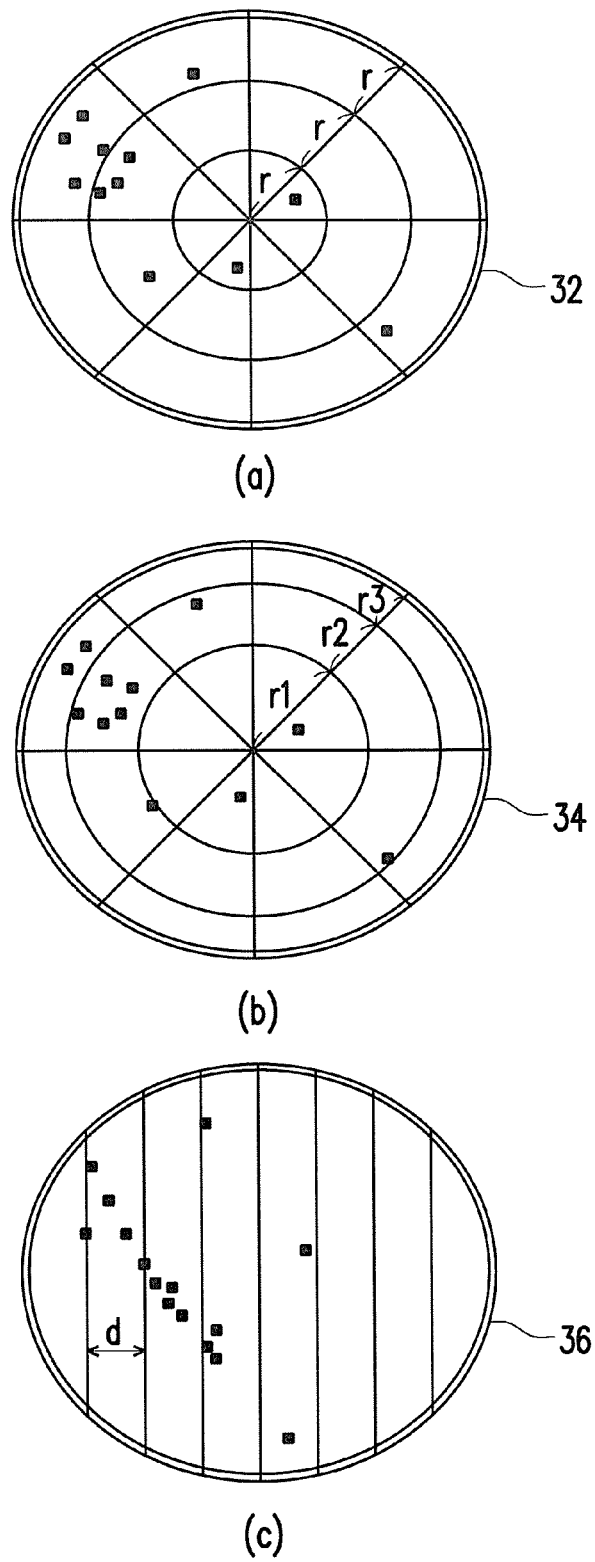
FIG. 3(a)-FIG. 3(c) are schematic diagrams of dividing testing partitions of a wafer according to an embodiment of the invention.

For example, FIG. 3(a)-FIG. 3(c) are schematic diagrams of dividing testing partitions of the wafer according to an embodiment of the invention. If it is required to determine whether the testing map contains the cluster pattern, since the cluster of the dies having defects are probably gathered in a specific partition on the wafer, a dividing method shown in FIG. 3(a) can be used, i.e. a center of a wafer 32 is taken as a circle center to divide the wafer 32 into a plurality of fan-shaped partitions, and a radius of the wafer 32 is cut into three equal parts (where a length of each part is r), and the fan-shaped partitions are divided into a plurality of testing partitions shown in FIG. 3(a) by circles with radiuses of r and 2r.

It should be noticed that the dividing method of FIG. 3(a) is to individually compare each testing partition to determine whether the cluster pattern is contained therein, and in another embodiment, ranges of the testing partitions can be adjusted, such that the testing partitions may have a same area. Under the condition of the same area, a gross die count in each testing partition is the same, and the dividing method may further compare the testing partitions to obtain the partition with higher number of the dies having the defects (i.e. with the cluster pattern). As shown in FIG. 3(b), besides dividing the wafer 34 into the fan-shaped partitions while taking the center of the wafer 34 as the circle center, the circles used for dividing the fan-shaped partitions can be further adjusted, and distances between the circle center and each of the circles are r1, r2 and r3, where r1>r2>r3, such that the areas of the testing partitions divided by the circles are the same.

On the other hand, if it is required to determine whether the testing map contains the straight line pattern, a dividing method shown in FIG. 3(c) can be adopted. Namely, the wafer 36 is divided into a plurality of strip-shaped partitions of a same width d to serve as the testing partitions.

Referring back to the flow of FIG. 2, the test machine can respectively test the dies in each testing partition of the wafer by using a plurality of sites of the probe card so as to obtain a testing map of the wafer (step S204). Along with different types of the probe card, a number of the configured sites can be 32, 64 or several hundreds, and in each of the testing processes, the probe card configured with multiple sites can be used to simultaneously perform the chip probing (CP) on the same number of the dies. By using the probe card to respectively perform the CP on the dies of different partitions in the single wafer, and integrating CP results of each of the partitions, the testing map of the whole wafer is obtained. The testing map may indicate positions of dies having defects and without defects.

Then, the test machine constructs chi-square test on the dies having defects and the dies without defect within each of the testing partitions to determine whether the dies having defects or the dies without defect have a special pattern. In detail, the test machine accumulates a number of the dies having defects and a number of the dies without defect within each of the testing partitions in the testing map to construct chi-square test and calculate a maximum P-value (step S206). For example, in allusion to each of the testing partitions, the test machine accumulates the number of the dies having defects to construct chi-square test and calculate a P-value thereof, and accumulates the number of the dies without defect to construct chi-square test and calculate a P-value thereof, and takes a maximum of the two P-values to serve as the maximum P-value.

For example, it is assumed that the wafer is divided into m testing partitions. When determining whether the fail dies of an $i^{th}$ testing partition have a special pattern, a chi-square test $\chi_{Fi}^2$, thereof can be calculated as follow:

$$\chi_{Fi}^2 = \frac{(E_i - EF_i)^2}{EF_i} \quad (1)$$

Then, a P-value $FPV_i$ can be calculated as follow:

$$FPV_i = P(\chi_1^2 > \chi_{Fi}^2) \quad (2)$$

Where, $F_i$ and $EF_i$ respectively represent a real number and a prediction number of fail dies in the $i^{th}$ testing partition, and $\chi_1^2$ represents a chi-square distribution with degrees of freedom of 1.

On the other hand, when determining whether the pass dies of the $i^{th}$ testing partition have the special pattern, a chi-square test $\chi_{Pi}^2$ thereof can be calculated as follow:

$$\chi_{Pi}^{(2)} = \frac{(P_i - EP_i)^2}{EP_i} \quad (3)$$

Then, a P-value $PPV_i$ can be calculated as follow:

$$PPV_i = P(\chi_1^2 > \chi_{Pi}^2) \quad (4)$$

Where, $P_i$ and $EP_i$ respectively represent a real number and a prediction number of the pass dies in the $i^{th}$ testing partition, and $\chi_1^2$ represents a chi-square distribution with degrees of freedom of 1.

Regarding each testing partition i, by obtaining a maximum of the P-value $FPV_i$ of the fail dies and the P-value $PPV_i$ of the pass dies, the maximum P-value $PV_i$ is calculated as follows:

$$PV_i = \max(FPV_i, PPV_i), i=1, \ldots, m \quad (5)$$

Finally, the test machine determines whether a minimum of the maximum P-values of all of the testing partitions is smaller than a threshold (step S208). The threshold is, for example, a nominal false-alarm rate a, and a value thereof is, for example, 0.05, though the invention is not limited thereto. The step S208 can be represented by a following mathematical expression:

$$\min(PV_1, \ldots, PV_m) < \alpha \quad (6)$$

If the minimum of the maximum P-values of all of the testing partitions is smaller than the threshold, it is determined that a testing map of the wafer contains the special pattern (step S210). Conversely, if the minimum of the maximum P-values of all of the testing partitions is not smaller than the threshold, it is determined that the testing map of the wafer does not contain the special pattern (step S212).

According to the above method, the special pattern in the wafer testing can be automatically detected, and the testing partition having the special pattern can be found to facilitate a repair operation of the tester, so as to achieve an effect of saving labor cost.

It should be noticed that by using the aforementioned dividing methods, a cluster is probably divided, and the dies belong to one cluster or a same straight line are probably divided into two or more testing partitions, which may result in a fact that the statistic result cannot reflect a real distribution status. Therefore, in an embodiment, after the test machine obtains the testing map of the wafer, besides determining whether the dies having defects or without defect in each testing partition have the special pattern, the test machine further rotates ranges of the testing partitions while taking the center of the wafer as a circle center, and accumulates a number of the dies having defects and a number of the dies without defect within each of the rotated testing partitions in the testing map to construct the chi-square test and calculate the maximum P-value, so as to determine whether the testing map of the wafer contains the special pattern according to whether the minimum of the maximum P-values is smaller than the threshold.

Figure 4:
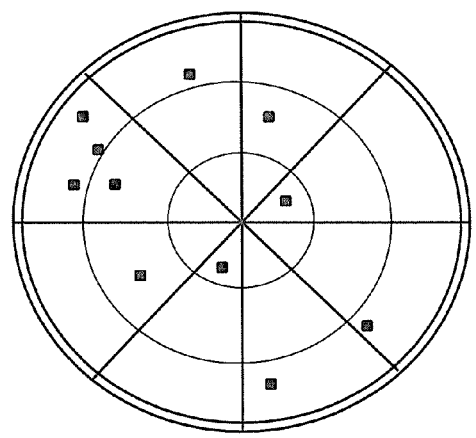
FIG. 4(a)-FIG. 4(c) are schematic diagrams of rotating testing partitions of a wafer according to an embodiment of the invention.
Figure 4:
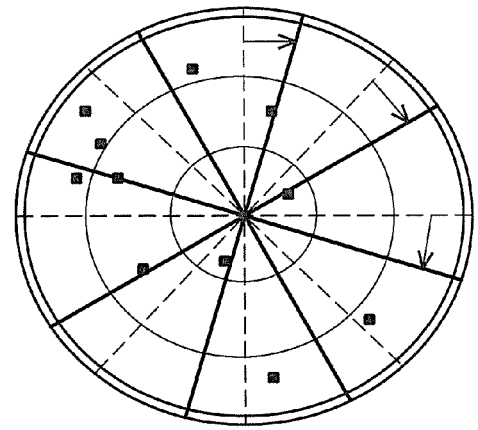
Figure 4:
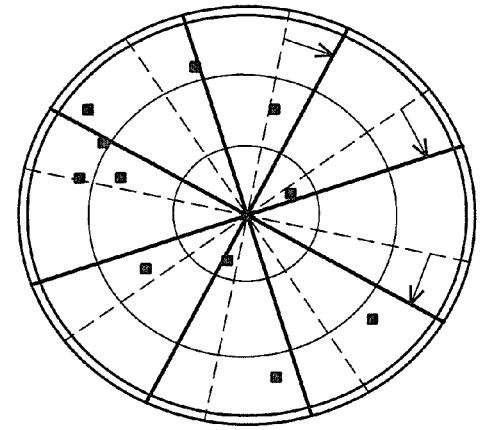

For example, FIG. 4(a)-FIG. 4(c) are schematic diagrams of rotating the testing partitions of the wafer according to an embodiment of the invention. The present embodiment is adapted to determine whether a testing map have the cluster pattern, and in FIG. 4(a), the testing machine divides the wafer into a plurality of testing partitions according to a method similar as that of FIG. 3(a). After the test machine detects whether the testing partitions of FIG. 4(a) have the special pattern, the testing partitions are rotated by a certain angle shown in FIG. 4(b), and the test machine again constructs the chi-square test of the rotated testing partitions to determine whether testing partitions have the special pattern. After the test machine determines whether the testing partitions of FIG. 4(b) have the special pattern, the testing partitions are rotated by a certain angle shown in FIG. 4(c), and the test machine again constructs the chi-square test of the rotated testing partitions to determine whether testing partitions have the special pattern. The above rotation angles can be determined by the tester according to an actual requirement and is not limited by the invention. By rotating the testing partitions for multiple times to determine the special pattern, probability of error resulted from the cluster of the dies is divided into different testing partition can be reduced, and accuracy of special pattern determination can be improved.

Moreover, according to the above method, besides the special pattern of the wafer testing is automatically detected, a position of the special pattern is further determined, so as to facilitate the repair operation of the tester. In detail, from all of the calculated maximum P-values, the test machine can find the testing partition corresponding to the maximum P-value smaller than the threshold, and determine that a testing map of the testing partition contains the special pattern.

Figure 5:
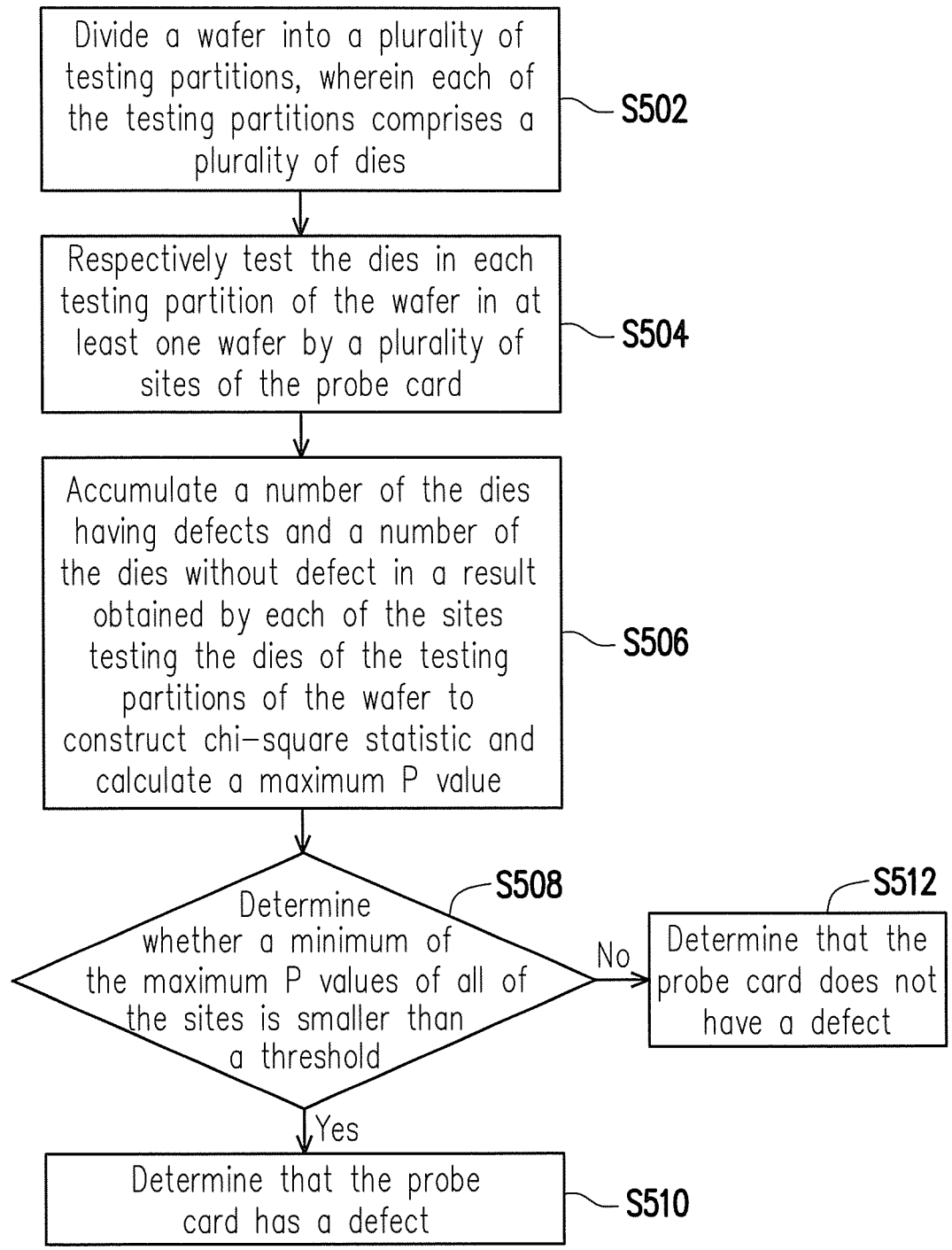
FIG. 5 is a flowchart illustrating a method for testing a probe card defect in wafer testing according to an embodiment of the invention.

On the other hand, regarding testing of probe card defect in wafer testing, FIG. 5 is a flowchart illustrating a method for testing a probe card defect in wafer testing according to an embodiment of the invention. Referring to FIG. 5, the method of the present embodiment is adapted for a test machine to determine whether a probe card of a wafer has a defect. The method includes following steps.

First, the test machine divides a wafer into a plurality of testing partitions according to type and size of a probe card, where each of the testing partitions includes a plurality of dies (step S502). Different to the aforementioned embodiment, in the present embodiment, the test machine divides the testing partitions according the number of the sites of the probe card being used. In detail, the number of the sites of the probe card determines a number of dies tested by the test machine for each CP, and the arrangement of the sites on the probe card determines the testing partitions tested by the test machine for each CP.

Figure 6:
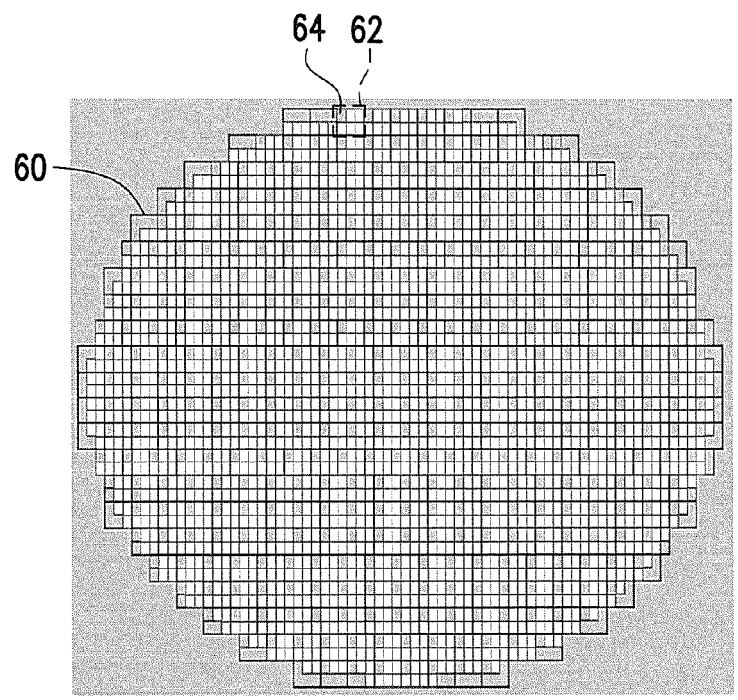
FIG. 6 is a schematic diagram of a probe card and testing partitions according to an embodiment of the invention.

For example, FIG. 6 is a schematic diagram of a probe card and testing partitions according to an embodiment of the invention. Referring to FIG. 6, when the probe card used by the test machine has 6 sites and the 6 sites are arranged in a rectangle of 3×2, the wafer 60 can be correspondingly divided into a plurality of 3×2 rectangular partitions (for example, a partition 62), so as to facilitate the probe card to perform CP. A site located at an upper left corner of the probe card is used to perform the CP on a die located at an upper left corner of each testing partition (for example, a die 64). By using the probe card to sequentially perform the CP on the testing partitions, the testing map of the whole wafer is obtained, and by counting the probing results of the dies located at different positions in each of the testing partitions (for example, the die located at the upper left corner), whether the probe card has a defect can be determined.

Figure 7:
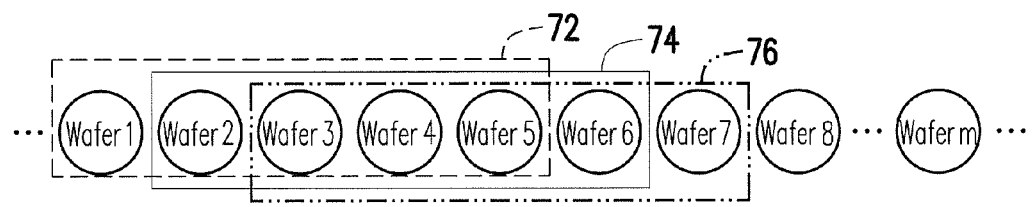
FIG. 7 is a schematic diagram of wafer testing according to an embodiment of the invention.

Referring back to the flow of FIG. 5, the test machine tests the dies in the testing partitions of each wafer in the at least one wafer by using a plurality of sites of the probe card (step S504). The test machine sequentially performs the CP on the divided testing partitions by using the probe card, though the tested wafer is not limited to one. In detail, besides that the wafer testing map is influenced by a site yield of the probe card, it is also influenced by a wafer yield. In order to avoid influence of the wafer yield on test of a single wafer, by which the defects of the sites of the probe card cannot be truly reflected, and the sample is probably inadequate when only the single wafer is tested, the test machine of the embodiment can simultaneously test a plurality of wafers. Taking FIG. 7 as an example, the test machine first test wafers 1-5 (a range 72), and then tests wafers 2-6 (a range 74), and further tests wafers 3-7 (a range 76), and so on.

Then, the test machine accumulates a number of the dies having defects and a number of the dies without defect in a result obtained by each of the sites testing the dies of the testing partitions of the at least one wafer to construct chi-square test and calculate a maximum P-value (step S506). In detail, regarding the dies tested by each of the sites, the test machine, for example, accumulates the number of the dies having defects to construct chi-square test and calculate a P-value thereof, and accumulates the number of the dies without defect to construct chi-square test and calculate a P-value thereof, and takes a maximum of the two P-values as the maximum P-value. Similar to the aforementioned embodiment where the chi-square test is constructed according to the dies having defects and the dies without defect in the testing map of each the testing partition, in the present embodiment, the chi-square test is constructed according to the dies having defects and the dies without defect in the testing map of each testing partition of each wafer tested by each site, so as to obtain the maximum P-value, and a calculation method thereof is similar as that described in the aforementioned embodiment, and details thereof are not repeated.

Figure 8:
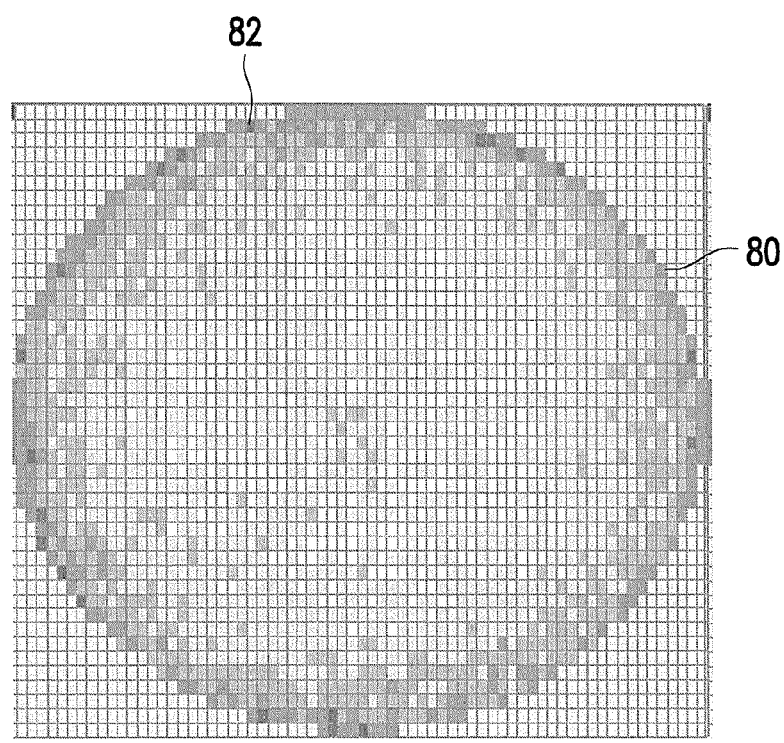
FIG. 8 is a schematic diagram of excluding testing maps of dies located at an edge according to an embodiment of the invention.

It should be noticed that since the dies located at an edge of the wafer are liable to be influenced by various factors to have a higher fail rate, in an embodiment, when the test machine accumulates the number of the dies having defects and the number of the dies without defect, the test machine, for example, excludes the testing maps of the dies located at the edge of the wafer. Taking FIG. 8 as an example, the test machine excludes the testing map of the dies (for example, a die 82) located at the edge of a wafer 80, i.e. the testing map of whether these dies have defects is not included in construction of the chi-square test.

Moreover, in another embodiment, before the chi-square test is constructed, the test machine, for example, accumulates a total number of the dies tested by each of the sites to ensue that the number of the tested dies are enough to determine whether the site has the defect. In detail, the test machine, for example, accumulates a total number of the dies within the testing partitions of the at least one wafer tested by each of the sites (excluding the dies located at the edge of the wafer), and determines whether the total number reaches a predetermined value (for example, 300), and only when the total number reaches the predetermined value, a number of the dies having defects and a number of the dies without defect in the dies tested by each of the sites are accumulated to construct the chi-square test and calculate the maximum P-value.

Finally, the test machine determines whether a minimum of the maximum P-values of all of the sites is smaller than a threshold (step S508). If the minimum of the maximum P-values of all of the sites is smaller than the threshold, it is determined that the probe card has a defect (step S510). Conversely, if the minimum of the maximum P-values of all of the sites is not smaller than the threshold, it is determined that the probe card does not have the defect (step S512).

According to the above method, besides that the defect of the probe card in the wafer testing is automatically detected, a position of the site having the defect can be further determined, so as to facilitate the repair operation of the tester. In detail, from all of the calculated maximum P-values, the test machine can find the site corresponding to the maximum P-value smaller than the threshold, and determine that the site has the defect.

It should be noticed that the methods of the invention are not only applied for detecting the special pattern and the probe card defect, but can also be applied for detecting the special pattern having two types of any characteristics on the wafer or detecting other defects, or even applied for detecting the special pattern or the defects on any object, and are not limited to the aforementioned implementations. Another embodiment is provided below for detailed description.

Figure 9:
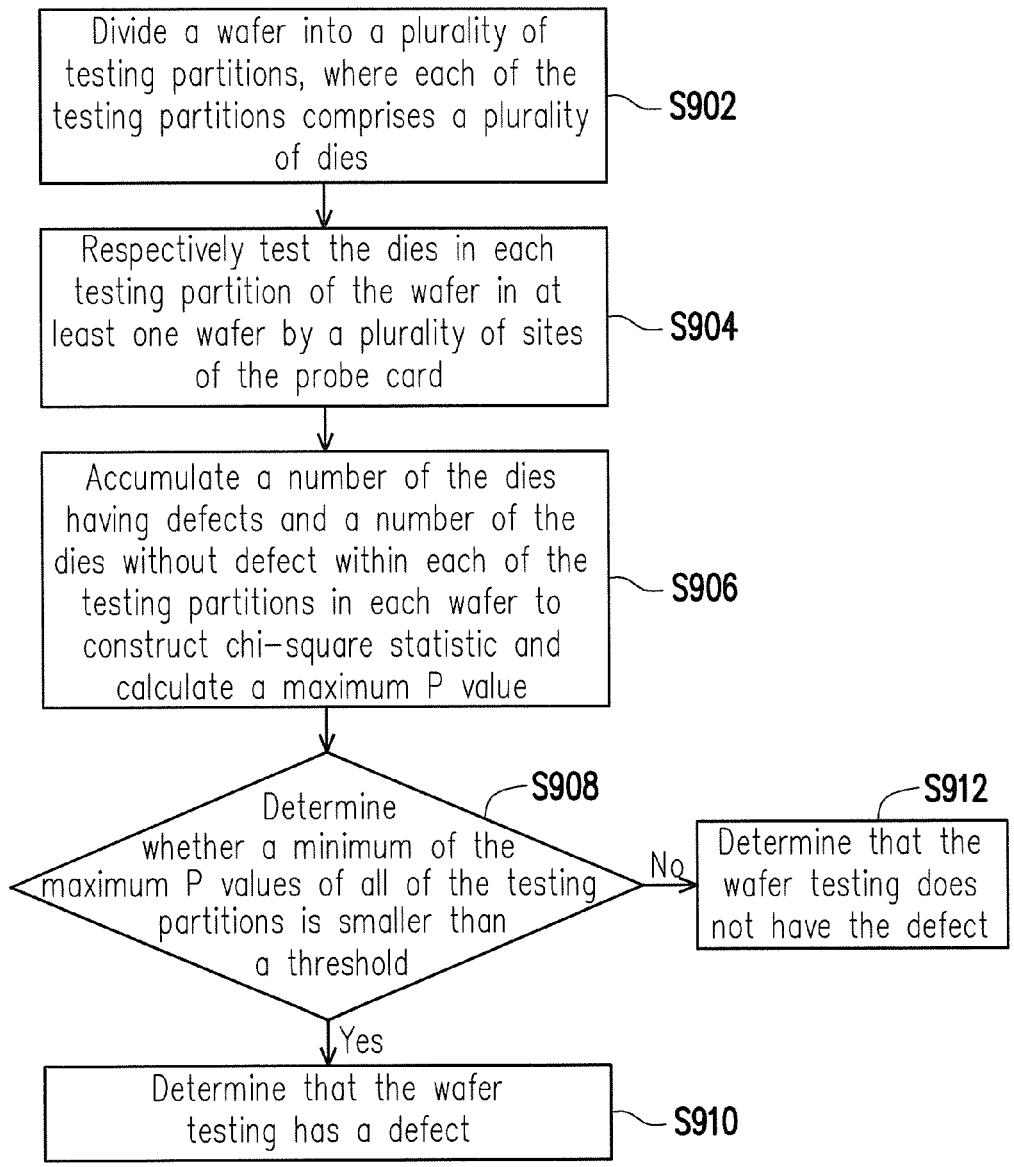
FIG. 9 is a flowchart illustrating a method for testing wafer testing according to an embodiment of the invention.

FIG. 9 is a flowchart illustrating a method for testing wafer testing according to an embodiment of the invention. Referring to FIG. 9, the method of the present embodiment is adapted for a test machine to determine whether a testing map of a wafer has a defect. The method is as follows:

First, the test machine divides a wafer is divided into a plurality of testing partitions according to a testing requirement of the tester, where each of the testing partitions includes a plurality of dies (step S902). The test machine can divide the wafer into the testing partitions according to a chip probing (CP) pattern to be tested by the tester, a testing range of the sites or other conditions to facilitate executing the follow up testing.

Then, the test machine tests the dies in the testing partitions of each wafer in the at least one wafer by using a plurality of sites of a probe card (step S904). The test machine, for example, sequentially performs the CP on the divided testing partitions by using the probe card, and the tested wafer is not limited to one.

Then, the test machine accumulates a number of the dies having defects and a number of the dies without defect within each of the testing partitions of each wafer to construct chi-square test and calculate a maximum P-value (step S906). Different to the aforementioned embodiment, in the present embodiment, the test machine can construct the chi-square test for different testing partitions in different wafers without being limited to a single wafer and limited to positions of the sites.

Finally, the test machine determines whether a minimum of the maximum P-values of all of the testing partitions is smaller than a threshold (step S908). If the minimum of the maximum P-values of all of the testing partitions is smaller than the threshold, it is determined that the wafer testing has a defect (step 910). Conversely, if the minimum of the maximum P-values of all of the testing partitions is not smaller than the threshold, it is determined that the wafer testing does not have a defect (step S912).

According to the aforementioned method, the defects of the wafer testing is automatically detected, and the testing partitions having the defects can be found to facilitate a repair operation of the tester, so as to achieve an effect of saving labor cost.

In summary, in the methods for testing the special pattern and testing the probe card defect in wafer testing of the invention, according to the special pattern to be tested or a configuration of the sites of the probe card, the wafer is divided into a plurality of testing partitions to respectively implement the CP. Regarding the testing map of each testing partition, the chi-square test is constructed to detect whether the testing map is abnormal, so as to automatically determine whether the special pattern and the probe card of the wafer testing has the defect. In this way, the labor cost for self determination of the tester is saved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for testing a special pattern in wafer testing, adapted for a test machine to determine whether a testing map of a wafer contains a special pattern, the method for testing the special pattern in wafer testing comprising:

dividing the wafer into a plurality of testing partitions, wherein each of the testing partitions comprises a plurality of dies;

respectively testing the dies in each testing partition of the wafer by a plurality of sites of the probe card to obtain the testing map of the wafer;

accumulating a number of the dies having defects and a number of the dies without defect within each of the testing partitions in the testing map to construct chi-square test and calculate a maximum P-value;

determining whether a minimum of the maximum P-values of all of the testing partitions is smaller than a threshold; and determining that the testing map of the wafer contains the special pattern when the minimum is smaller than the threshold.

2. The method for testing the special pattern in wafer testing as claimed in claim 1, wherein the step of dividing the wafer into the testing partitions comprises:

dividing the wafer into a plurality of fan-shaped partitions while taking a center of the wafer as a circle center, and dividing the fan-shaped partitions into the testing partitions by circles of different radiuses.

3. The method for testing the special pattern in wafer testing as claimed in claim 1, wherein the step of dividing the wafer into the testing partitions comprises:

dividing the wafer into a plurality of strip-shaped partitions of a same width to serve as the testing partitions.

4. The method for testing the special pattern in wafer testing as claimed in claim 1, wherein the step of dividing the wafer into the testing partitions comprises:

adjusting ranges of the testing partitions, such that the testing partitions have a same area.

5. The method for testing the special pattern in wafer testing as claimed in claim 1, wherein after the step of testing the dies in each testing partition of the wafer by the sites of the probe card to obtain the testing map of the wafer, the method further comprises:

rotating ranges of the testing partitions while taking a center of the wafer as a circle center; and accumulating a number of the dies having defects and a number of the dies without defect within each of the rotated testing partitions in the testing map to construct the chi-square test and calculate the maximum P-value, so as to determine whether the testing map of the wafer contains the special pattern according to whether the minimum of the maximum P-values is smaller than the threshold.

6. The method for testing the special pattern in wafer testing as claimed in claim 1, wherein in the step of determining whether the minimum of the maximum P-values is smaller than the threshold, when the minimum is smaller than the threshold, the method further comprises:

determining that the testing map of the testing partition corresponding to the maximum P-value smaller than the threshold contains the special pattern.

7. A method for testing a probe card defect in wafer testing, adapted for a test machine to determine whether a probe card of a wafer has a defect, the method for testing the probe card defect in wafer testing comprising:
- dividing the wafer into a plurality of testing partitions, wherein each of the testing partitions comprises a plurality of dies;
- respectively testing the dies in each testing partition of the wafer in at least one wafer by a plurality of sites of the probe card;
- accumulating a number of the dies having defects and a number of the dies without defect in a result obtained by each of the sites testing the dies of the testing partitions of the wafer to construct chi-square test and calculate a maximum P-value;
- determining whether a minimum of the maximum P-values of all of the sites is smaller than a threshold; and
- determining that the probe card has a defect when the minimum is smaller than the threshold.

8. The method for testing the probe card defect in wafer testing as claimed in claim 7, wherein the step of accumulating the number of the dies having defects and the number of the dies without defect in the result obtained by each of the sites testing the dies of the testing partitions of the wafer to construct the chi-square test and calculate the maximum P-value further comprises:
- excluding the result of the dies located at an edge of the wafer when accumulating the number of the dies having defects and the number of the dies without defect.

9. The method for testing the probe card defect in wafer testing as claimed in claim 7, wherein the step of accumulating the number of the dies having defects and the number of the dies without defect in the result obtained by each of the sites testing the dies of the testing partitions of the wafer to construct the chi-square test and calculate the maximum P-value further comprises:
- accumulating a total number of the dies within the testing partitions of the wafer tested by each of the sites, and determining whether the total number reaches a predetermined value; and
- accumulating a number of the dies having defects and a number of the dies without defect in the dies tested by each of the sites to construct the chi-square test and calculate the maximum P-value when the total number reaches the predetermined value.

10. A method for testing wafer testing, adapted for a test machine to determine whether a testing result of at least one wafer has a defect, the method for testing wafer testing comprising:
- dividing each wafer into a plurality of testing partitions, wherein each of the testing partitions comprises a plurality of dies;
- respectively testing the dies in the testing partitions of each wafer in the at least one wafer by a plurality of sites of a probe card;
- accumulating a number of the dies having defects and a number of the dies without defect within each of the testing partitions of each wafer to construct chi-square test and calculate a maximum P-value;
- determining whether a minimum of the maximum P-values of all of the testing partitions is smaller than a threshold; and
- determining that the wafer testing has a defect when the minimum is smaller than the threshold.

* * * * *